United States Patent

Nevin

[11] Patent Number: 5,986,508
[45] Date of Patent: Nov. 16, 1999

[54] BIAS CONCEPT FOR INTRINSIC GAIN STABILIZATION OVER TEMPERATURE

[76] Inventor: Larry J. Nevin, P.O. Box 1956, Thousand Oaks, Calif. 91358

[21] Appl. No.: 08/703,386

[22] Filed: Aug. 26, 1996

[51] Int. Cl.⁶ ...................................................... H03F 1/30
[52] U.S. Cl. ........................... 330/289; 330/290; 330/296
[58] Field of Search ................................... 330/256, 266, 330/272, 277, 289, 290, 296

[56] References Cited

U.S. PATENT DOCUMENTS

5,365,189  11/1994  Coulson .............................. 330/256 X

*Primary Examiner*—James B. Mullins
*Attorney, Agent, or Firm*—Gene W. Arant; Larry D. Baker

[57] ABSTRACT

An amplifier for systems affected by changes in operating temperature, in which the amplifier gain is stabilized over temperature. A temperature compensating control element is added to the previously known active bias control amplifiers, forming a second control loop. This control acts to modify the device bias current, in a way which holds the device gain constant as temperature varies. In so doing it implements, in the circuit, the mathematically derived current variation which, based on the physics of the device, maintains constant gain. The additional circuitry is very inexpensive, preserving the cost-effectiveness of the integrated circuit bias scheme for those applications requiring the additional bias control.

3 Claims, 12 Drawing Sheets

# BIAS CONCEPT FOR INTRINSIC GAIN STABILIZATION OVER TEMPERATURE

FIELD OF THE INVENTION

The invention relates to circuitry associated with transistor devices.

RELATED APPLICATION

The present patent application is based upon the use of active bias circuits, which control the bias parameter in an active device by sensing its level with an external amplifier, and applying the amplified difference between this level and a reference level to a control terminal on the active device itself, in the proper sense to correct the bias level such that it approaches the reference level, in accordance with the principles of negative feedback control. One example of such an active bias system is my previous application Ser. No. 08/502,073 filed Jul. 14, 1995, and now U.S. Pat. No. 5,627,458, and entitled "Integrated Negative D-C Bias Circuit".

BACKGROUND OF THE INVENTION

In wireless communication systems, very high frequency signals are transmitted from satellite, aircraft or land-based transmitters, and subsequently received as highly attenuated signals which may in turn be on land, in air or in space. Due to the effects of attenuation over distance, and the presence of interfering signals in the signal environment, the communication signals must be raised to a high level at the transmitter, and again restored to detectable levels at the receiver. The amplifiers used for this purpose in both transmitters and receivers, while differing in many details, nonetheless each involve several stages of signal amplification, often designed using Gallium Arsenide (GaAs)-based transistors and integrated circuits. For each amplifier stage, it is required to provide an appropriate D-C bias to the operating transistors, in the form of prescribed voltages and currents applied to the device terminals. Since the biasing needs of the various stages will, in general, be somewhat different, it has therefore been the usual practice to provide a separate biasing circuit as an integral part of each associated amplifier stage. Thus biasing circuits may represent a significant portion of the electronic content of the receiver.

In certain specific fields of application, such as satellite broadcast television, the low-noise receiver amplifiers are manufactured in large quantities, in a very competitive economy which drives continuing reductions in cost and price.

SUMMARY OF PRIOR ART

Figure 1:
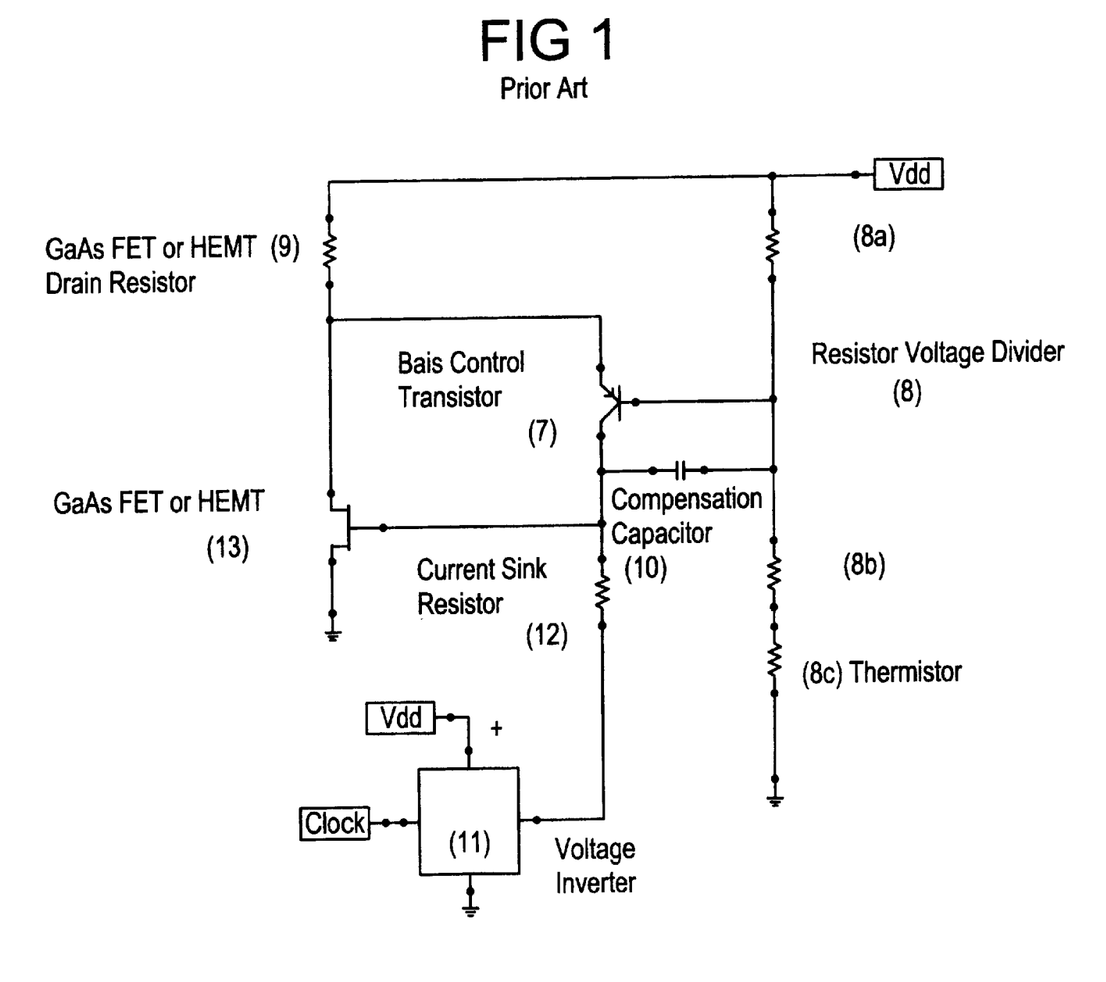
FIG. 1 is a schematic diagram of a prior art amplifier stage with active bias control, including an extrinsic thermistor temperature compensation element.

FIG. 1 shows the conventional active bias circuit in which a bias control amplifier (the bipolar transistor) measures an actual bias point, compares it to a reference voltage, and actively controls the bias point to the desired value by applying a correction voltage to the control gate of the GaAs FET ("Gallium Arsenide Field Effect Transistor" or HEMT ("High Electron Mobility Transistor") device such that measurement and reference are equal. This circuit, operating to provide fixed bias, is the most common example of prior art. When modified with the addition of a thermistor introduced into the bias reference voltage divider, as shown, the resulting circuit is also prior art and now offers a degree of temperature compensation. The thermistor is a well-known device which is used extensively as a temperature-varying resistor in electronic designs. Due to the decreasing resistance of the thermistor as temperature increases, the bias reference voltage for this circuit can be made to decrease with increasing temperature, causing the GaAs FET or HEMT device bias current to increase accordingly. By careful selection of the thermistor and the various fixed resistors, the bias current can be caused to vary with temperature in a way which approximates that variation required to keep signal gain relatively constant in the device.

In the applications discussed above, the cost of the bias function is most important, and the previous invention was directed specifically at offering the lowest-cost solution for those requirements. In particular, it was designed to control device current to a specified and fixed level, set automatically by the bias circuit and related components, obviating any requirement for hand setting the level using expensive labor in a manufacturing environment. In addition to reducing labor costs, the tightly controlled fixed bias current level was provided as the correct technical solution for a broad range of amplifier requirements.

SUMMARY OF THE PRESENT INVENTION

In any wireless communication system, the performance specification of the combined amplifiers is a specialized balance of gain, noise figure, distortion and frequency response, and in general all of these are affected by operating temperature. Nevertheless, I have concluded from my experience that of all these parameters, the one that varies most and has the most overall impact is that of signal gain, and therefore this property is the focus of the invention, namely to stabilize gain of amplifier stages over temperature.

In this invention, a new concept is devised, which introduces a temperature compensating control element to the previous bias control amplifiers, forming a second control loop. This control acts to modify the desired external device bias current, in a way which contrives to keep the device gain constant as temperature varies. In so doing it implements, in the circuit, the mathematically derived current variation which, based on the physics of the device, maintains constant gain.

The formulation of this new invention feature derives from the physics of the amplifying devices, which lead to a temperature model for gain performance, which in turn leads to a simple circuit technique which satisfies the model requirements to minimize gain variation over temperature. Further, the additional circuitry is very inexpensive, preserving the cost-effectiveness of the integrated circuit bias scheme for those applications requiring the additional bias control.

The present invention relates to a circuit technique, which may be implemented as a monolithic integrated circuit, for controlling the D-C bias currents of a plurality of external devices, such as amplifier stages, especially in applications where amplifier gain must be tightly controlled over operating temperature. This new invention retains all the cost and other benefits of the previous one, and now adds the constancy of performance parameters over a large operating temperature range.

Thus the object of the present invention is to provide biasing or other control circuitry for the amplifying devices in single- or multi-stage amplifiers, which will have a reduced cost of manufacture compared to the prior art, without sacrifice of performance or quality, and to improve performance in respect to maintaining constant gain over temperature with a minimum cost of components and manufacturing labor.

LIST OF REFERENCE NUMBERS AND PART NAMES

7 Bias control transistor
8 Resistor voltage divider
8c Thermistor
9 GaAs FET or HEMT drain resistor
10 Compensation capacitor
11 Negative voltage generator
12 Current sink resistor
13 GaAs FET or HEMT (bipolar bias scheme)
14 Transistor active bias system with extrinsic temperature compensation
14a Active bias block diagram with extrinsic temperature compensation
14b Active bias block diagram with intrinsic temperature compensation
15 Monolithic integrated bias circuit
15a Monolithic integrated bias circuit with intrinsic temperature compensation for case Vth constant with temperature
15b Monolithic integrated bias circuit with intrinsic temperature compensation for case Vth varying with temperature
16 GaAs FET or HEMT amplifier device
16a GaAs FET or HEMT sensor device
17 GaAs FET or HEMT control gate
17a GaAs FET or HEMT source terminal
18 Bias control amplifier
19 Positive voltage supply
19a Negative voltage supply
20 Bias error reference voltage
22 Circuit ground
24 Voltage inverter
28 Bias feedback terminal
30 Bias output terminal
31 Internal bias network
34 Astable multivibrator
35 GaAs FET or HEMT drain resistor
86 Bias reference control amplifier
87 Bias reference setting voltage

DESCRIPTION OF THE INVENTION

Figure 2:
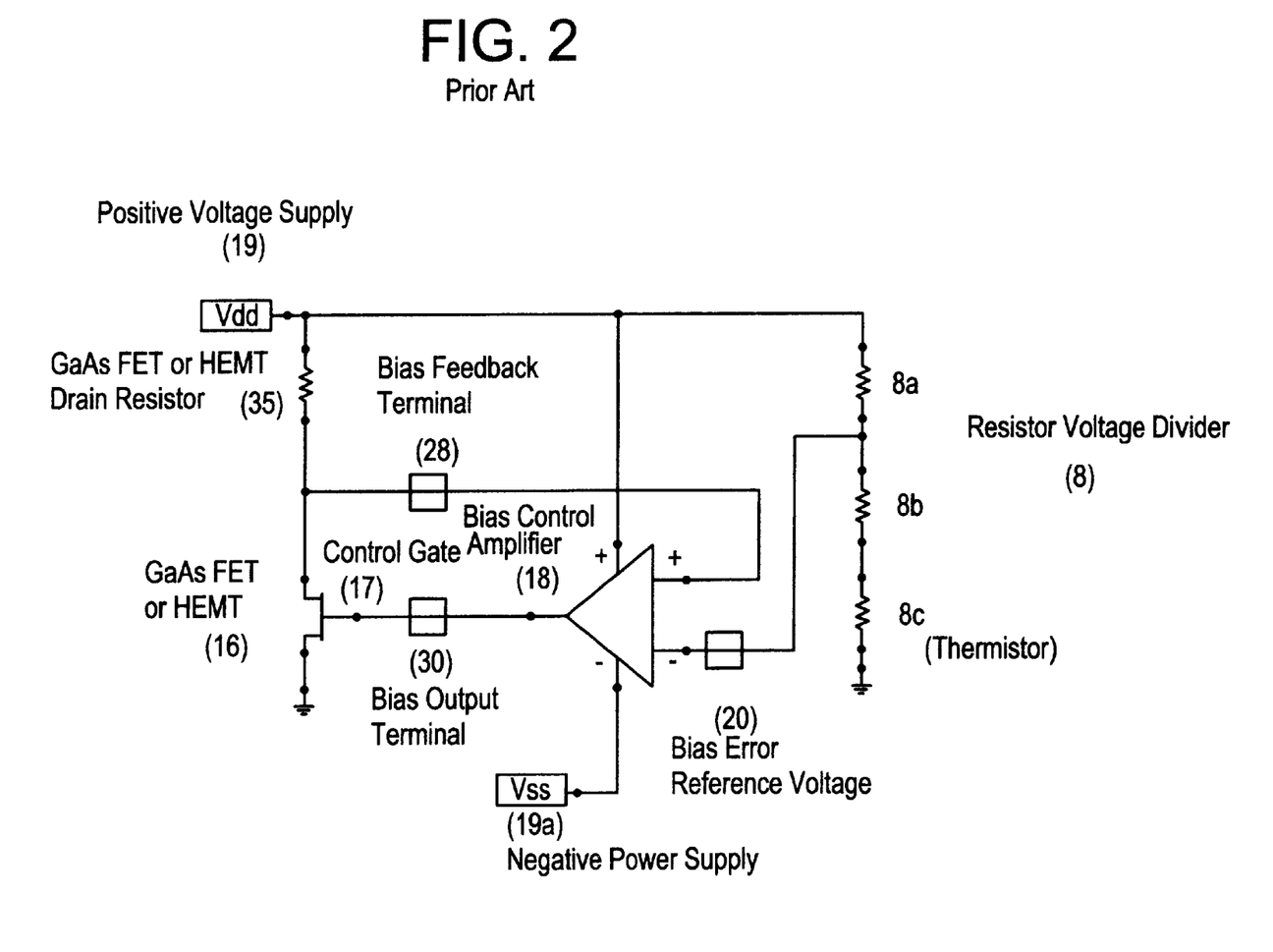
FIG. 2 is a block diagram of the active bias circuit with extrinsic temperature compensation.

As an introduction to the circuitry of the present invention, FIG. 2 shows a block diagram of an active bias circuit, operating in the same way as the explicit circuit of FIG. 1, and thus described as follows: each of the external amplifier stages (represented by GaAs FETs or HEMTs *16) has a control terminal, and a bias circuit parameter that can be measured as a voltage. The circuit may include a plurality of bias control amplifiers *18, one for each of several external amplifier stages *16. A voltage feedback signal indicative of a measurement of the bias current in each one of the respective external amplifier circuits is supplied to the corresponding one of the bias control amplifiers *18 at its bias feedback terminal *28. Each bias control amplifier *18 then operates to compare the received voltage feedback signal and a bias error reference voltage *20 which is derived from the positive supply voltage and/or the negative supply voltage, for producing an error signal indicative of an error in the bias current in the respective external amplifier stage *16, and also for amplifying that error signal. The amplified error signal is then supplied to the control gate *17 of the associated amplifier stage *16, and operates as negative feedback to control the bias current to its desired value. The value of the bias current thus set is equal to the value difference of the positive supply voltage *19 minus the bias error reference voltage *20, divided by the value of the GaAs FET or HEMT drain resistor *35. A positive voltage supply *19 is supplied to power the external devices *16 and the bias control amplifiers *18, and is used also to derive the error reference voltage *20. An additional negative power supply voltage Vss *19a is provided as needed.

Figure 3:
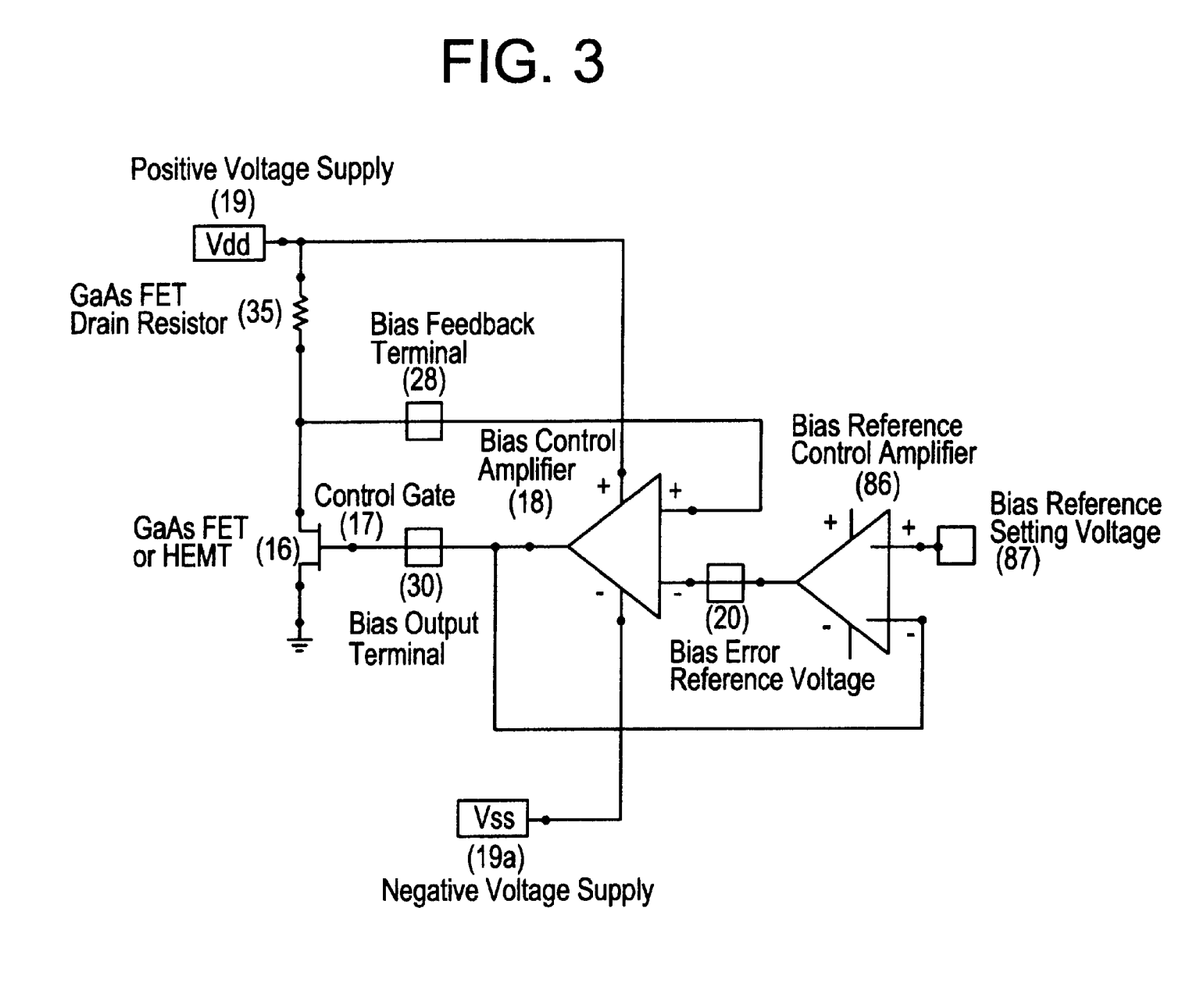
FIG. 3 is a block diagram of the active bias circuit with the new invention added for intrinsic temperature control.

The present invention is a modification of the concepts and configuration of FIG. 2, and is shown in FIG. 3. In this invention, the bias error reference voltage *20 is now controlled as a varying function of the control voltage that is applied to the external device at its control gate *17, in such a way that the bias current is adjusted as a function of this control voltage, satisfying requirements set by the physics of the device to preserve a fixed amount of signal gain, which would otherwise vary over temperature of operation.

The invention derives from the basic physics of GaAs FET or HEMT conduction and its relationship to the device control gate. In this relationship, the device drain current is related to the gate voltage and other properties by $Ids=\beta \cdot (Vg-Vth)^2$, in which Vg is the control gate voltage, Vth is a threshold voltage for the device, defined essentially as the value of gate voltage which sets Ids=0, and $\beta$ is a combination of geometric and electronic parameters for which, in the present analysis, details are not important, except that they are not functions of Vg.

Figure 4:
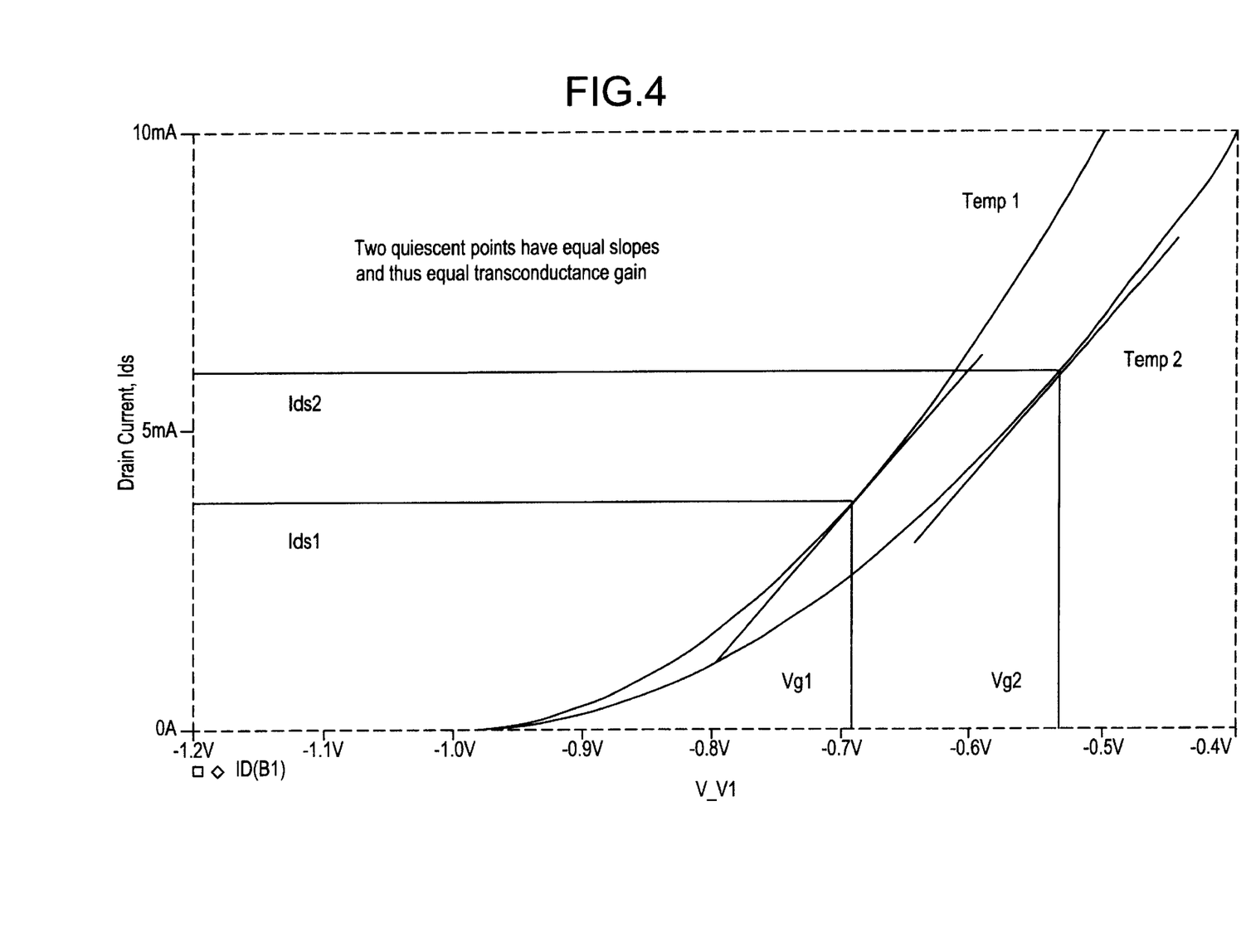
FIG. 4 is a device characteristic curve upon which intrinsic temperature compensation is based.

FIG. 4 graphs the relationship between drain current Ids and gate voltage, with temperature as a parameter. The signal gain of the device is established by the slope of the current function Ids, measuring the variation of Ids with changes in Vg. Specifically, the gain is proportional to Gm (the "transconductance") which is defined by the first derivative of Ids: $Gm=dIds/dVg=2\cdot\beta\cdot(Vg-Vth)$. Because of the expression for Ids, this last term can be written in terms of Ids, which of course is a measurable quantity in the invention circuit application: $Gm=2\cdot Ids/(Vg-Vth)$. It is Gm that we wish to keep constant with temperature, even though Ids and Vg (but, in the first case we consider here, not Vth) will both be temperature variant.

Nominally, in the biasing of a GaAs FET or HEMT device, a predetermined value of bias current Ids is desired, in order to optimize the performance features of the design. But since, as temperature changes, the voltage Vg required to establish that Ids will change, then Gm will change also if Ids is fixed. In the new invention both Vg and Ids are allowed to change, but in a way prescribed by the circuit design to keep Gm constant nevertheless.

To see how this occurs, we refer again to the definition Gm=2Ids/(Vg−Vth). We noted earlier that Ids was a linear function of the bias error reference voltage *20, and in the invention we derive this reference voltage as a linear function of the gate voltage Vg. If we make this general substitution we find Gm=C1·[(Vg−C2)/(Vg−Vth)], where C1 and C2 are constants to be realized in the circuit design and only Vg is temperature dependent. By choosing C1=Gmo and C2=Vth, the constant gain behavior can be realized. The detailed mathematical derivation of these effects, leading to the circuit invention, is attached in Appendix A.

An additional facet of the invention addresses the case in which the previously mentioned Vth, the threshold voltage for the device, does in fact vary significantly with temperature. In this case, the formulation must be altered, in accordance with the mathematical description of Appendix B, to provide that the composite voltage (Vg−Vth) be used, instead of Vg itself, to determine the bias error reference voltage *20. As stated previously, Vth is an internal parameter of the GaAs FET or HEMT device *16, and thus not nominally available in the circuit. However, the use of a separate GaAs FET or HEMT device, or a portion of said device added to the GaAs FET or HEMT chip for the specific purpose, can be used to develop the desired voltage, provided that device operates with a similar threshold voltage Vth over temperature. The separate device is connected so that its drain terminal voltage is similar to the amplifier device drain terminal voltage, its gate terminal is connected directly to the gate terminal of the amplifying device, and its source terminal is connected through a source resistor to the source terminal of the amplifying device. If the source resistor value is chosen to be large enough so that the device current is correspondingly small, but small enough such that the source impedance at the source terminal is well less than the input impedance of the bias reference control amplifier, then the source voltage of that device will closely approximate Vg−Vth, which is thus a measurable voltage as required to produce the bias error reference voltage *20. This further modification removes the limitation on temperature variation of Vth.

DESCRIPTION OF THE PREFERRED EMBODIMENT

Integrated Circuit

In order to achieve a low cost D-C bias circuit, a high level of integration of the discrete components must be attained. In addition, the size of the integrated circuit, and the pin count of the package which contains it, must also be minimized as factors contributing to cost. These were the features of the previous invention. The present invention adds the technically significant temperature compensation feature with very little increase in integrated circuit size and cost.

Figure 5:
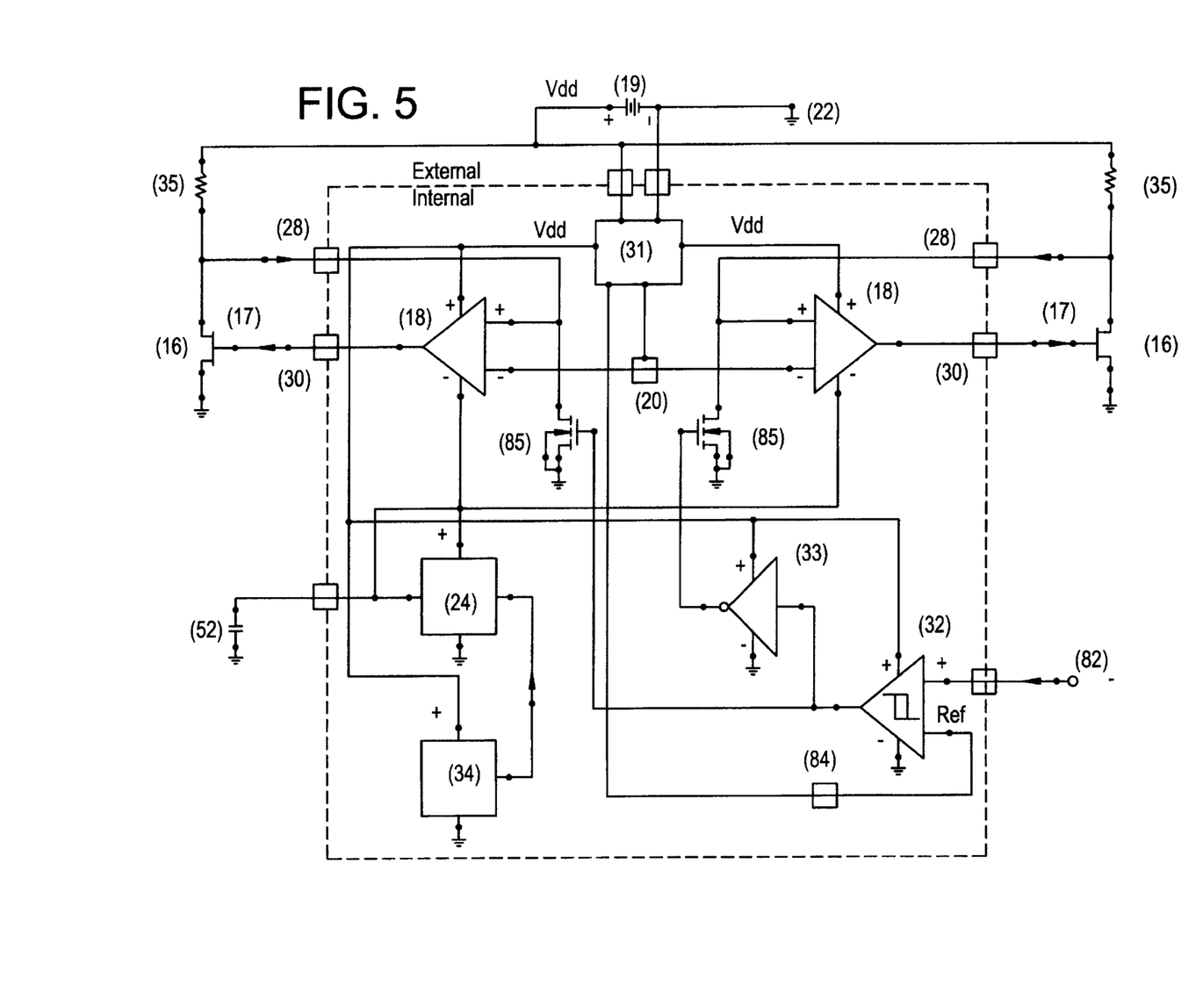
FIG. 5 is the block diagram of the previous invention monolithic integrated bias circuit.

The previous invention, shown in FIG. 5, includes a set of active bias circuits which operate in accordance with the description of FIG. 3, which is in fact a portion of the previous invention. The full invention was a fully monolithic integrated D-C bias circuit, which included the circuits for the generation of required negative voltages from the positive voltage input, in addition to the active bias control circuits. It also included the means for activating and deactivating sets of the external stages as instructed by an external control line. Each function in the design was realized as a minimum cost element, to achieve a minimum cost for the integrated D-C bias circuit, through minimization of circuit complexity and size in designs which were by themselves also a significant part of the invention.

The embodiment was of C-MOS ("Complementary Metal Oxide Semiconductor") monolithic integrated circuit design, which offers a low cost process, with simplicity of design for the switching functions involved in the inverter function, and which also cost-effectively provides on-chip capacitance of sufficient magnitude to internally support the required bias circuit functions, thus saving package and other component costs.

The current invention is defined by the mathematics in Appendix A for the case where Vth is invariant with temperature, any by Appendix B where Vth is expected to vary, and by the addition of a Bias Reference Control Amplifier *86, which works in conjunction with the previous invention, providing thereto a dynamically controlled bias error reference voltage *20. The circuit element which is added for this purpose is described below, and represented in the schematic of FIG. 6a, for invariant Vth, and FIG. 6b for variable Vth.

Bias Reference Control Amplifier

Figure 6A:
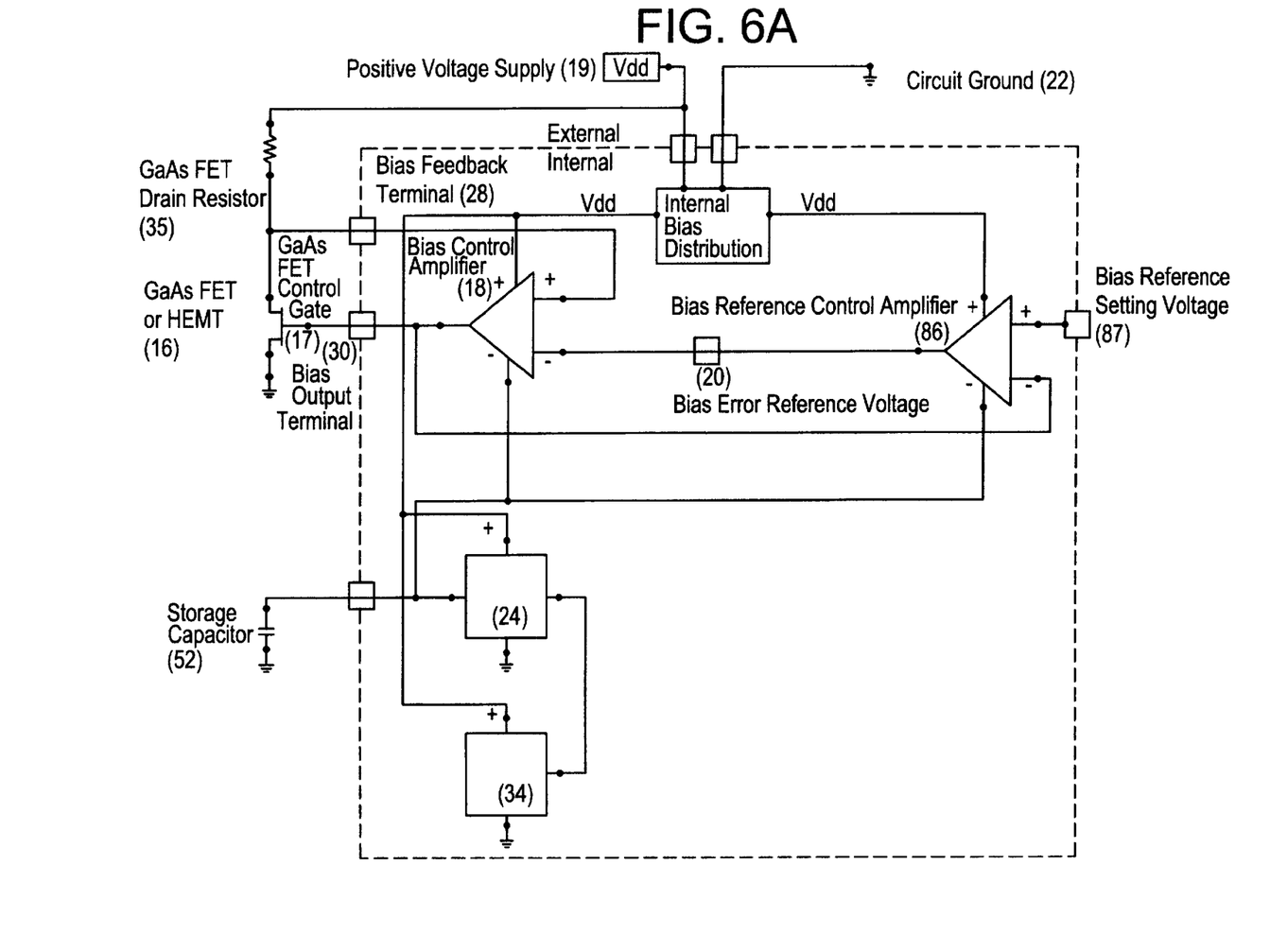
FIG. 6a is a schematic block diagram of the preferred form of the novel integrated D-C bias circuit, modified from the previous invention to include the new invention concept, for constant Vth.

In the case where Vth is invariant, as depicted in FIG. 6a, the bias reference control amplifier amplifies the difference between the signal at the bias output terminal *30 (which is applied to the external device control gate *17) and the bias reference setting voltage *87, and presents this voltage to the bias control amplifier *18 as the bias error reference voltage *20. The bias control amplifier *18 forms a closed loop system with its external biased GaAs FET or HEMT *16 device, as in the previous invention. Under normal operation, the loop gain is negative, which means the closed loop system is in a quiescent state and establishes a D-C bias current in the GaAs FET or HEMT *16 device. This D-C bias current is a function of the power supply voltage *19, the GaAs FET or HEMT drain resistor *35, and the bias error reference voltage *20. Because of variation in GaAs FET or HEMT *16 device properties with temperature, the GaAs FET or HEMT *16 control gate voltage *17 will change as operating temperature changes. In turn, the difference between its changed and nominal value will be amplified to reflect a corresponding change in the bias error reference voltage *20. As is shown in Appendix A, the amount of amplification will be chosen to ensure that the change in the bias error reference voltage *20 will be just that required to maintain the gain at its nominal value even as temperature varies.

The bias reference setting voltage *87 establishes the baseline bias current level, at a specific nominal temperature, for each external device. It is largely a predetermined value, established by the desired current level and related fixed voltages and resistors in the application, and by the control gate *17 voltage and Gm value which obtain at the nominal temperature and bias. Since these are all directly measurable, the setting is simple, and requires no further consideration for temperature compensation as in prior art schemes, since the invention provides this compensation as an automatic feature.

Figure 6B:
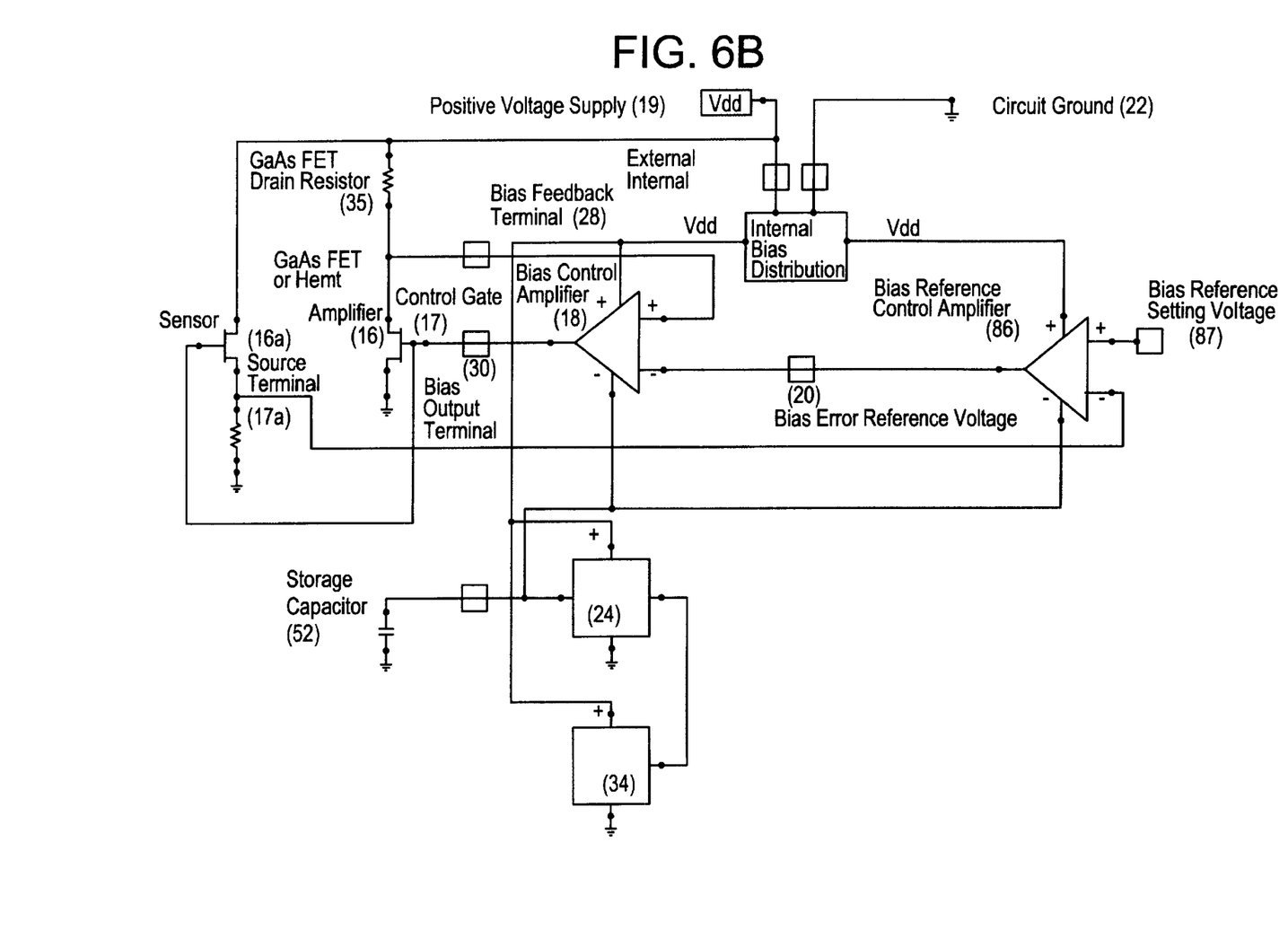
FIG. 6b is a modification of FIG. 6a to allow variable Vth.

For the case where Vth can vary with temperature, then the above description is modified only in the source of the input voltage to the bias reference control amplifier *86. In this case, that input is taken from the sensor GaAs FET or HEMT source terminal *17a, as shown in FIG. 6b.

Figure 7:
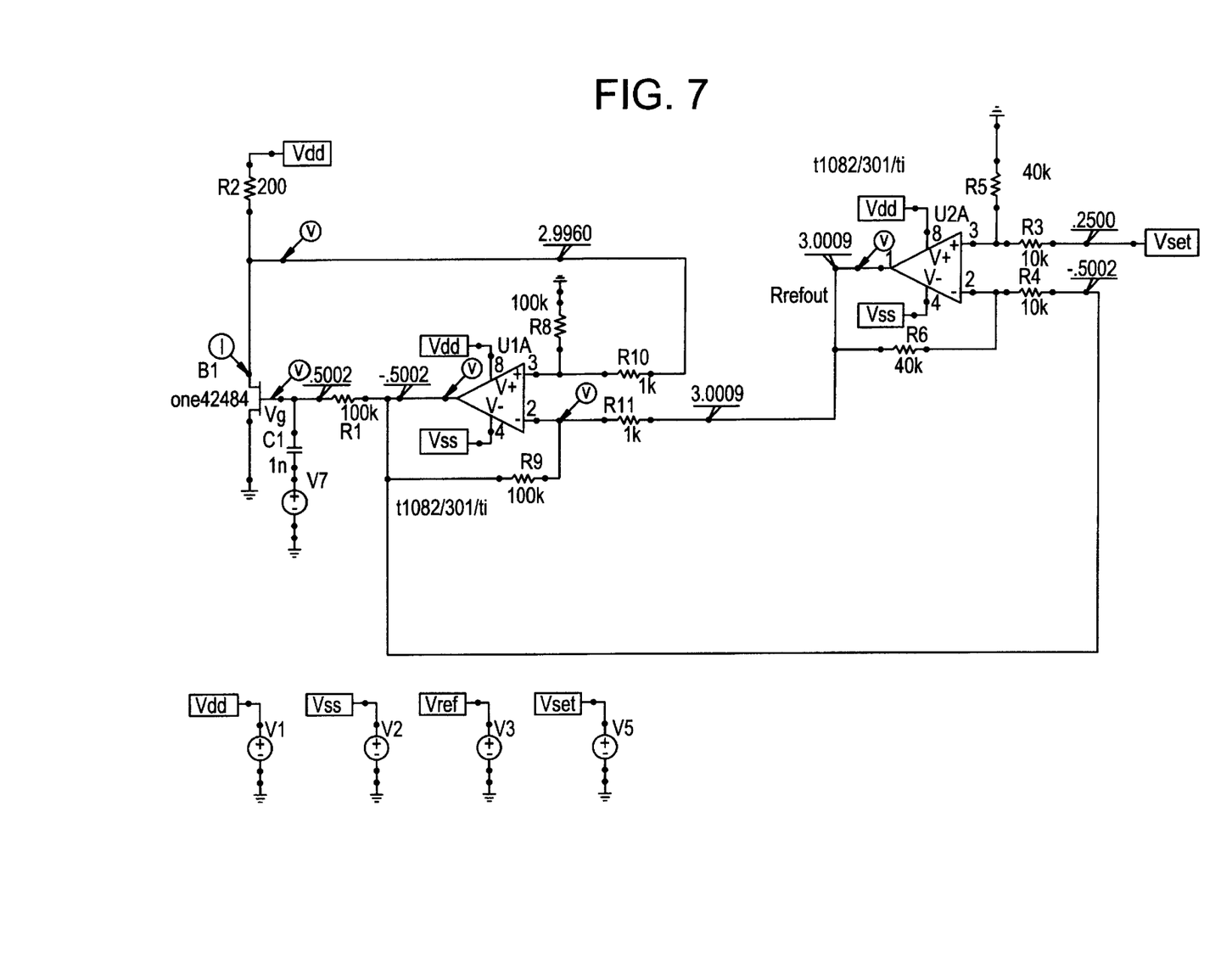
FIG. 7 is the SPICE circuit simulation schematic which is to test the invention concept.
Figure 8:
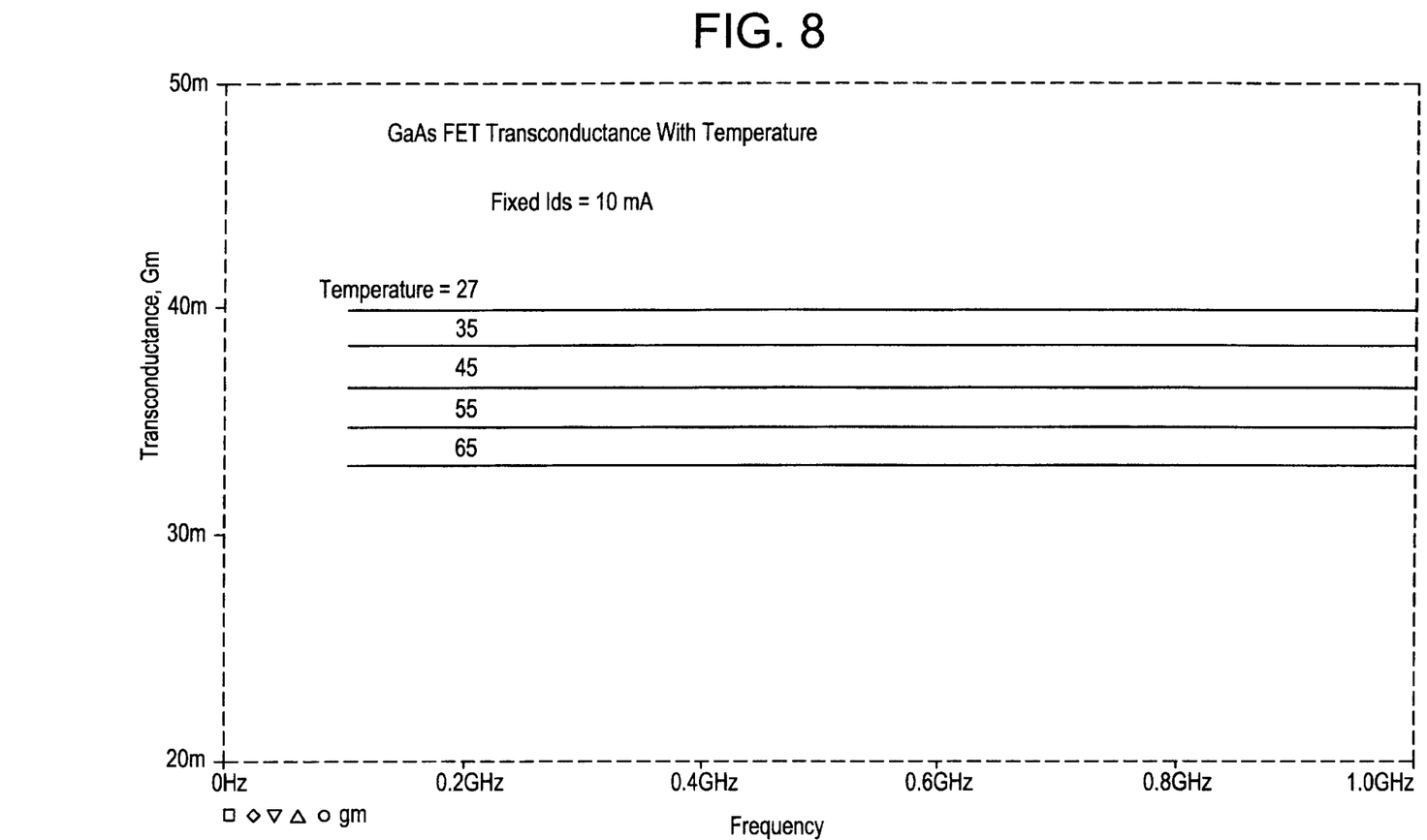
FIG. 8 shows simulation results for Gm in the case of fixed active bias without temperature compensation.
Figure 9:
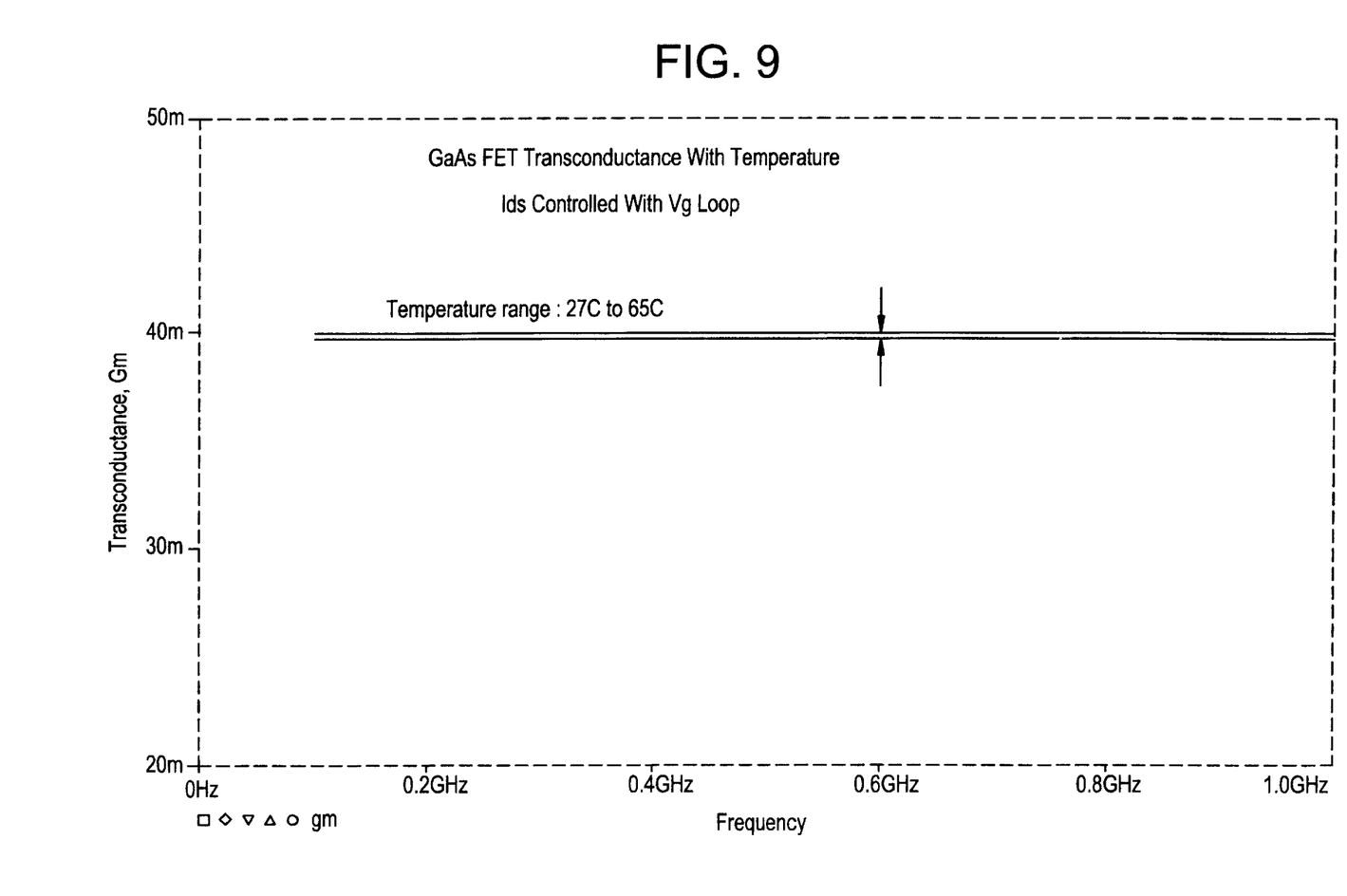
FIG. 9 shows simulation results for Gm in the case of intrinsic temperature compensation according to the new invention.

FIG. 7 shows a schematic used in a spice simulation of the invention concept. FIG. 8 shows the resulting device Gm, measured over a frequency range, with temperature as a parameter, in the case where the bias reference voltage is held constant (fixed bias case). The Gm in this case shows considerable variation. In FIG. 9, the additional control of the present invention is applied, and the variation of Gm is seen to be dramatically reduced over the same temperature range, as should be expected.

The preferred embodiment of the new invention includes monolithic integration in C-MOS processes, for the same reasons supported in the previous invention, and with which it can be readily combined with very small additions to existing circuitry.

GENERALIZATIONS OF THE CONCEPT

This invention is defined in terms of applications involving amplifier stages using GaAs FET or HEMT amplifying devices. These devices are specific examples of dynamic physical systems, in which the relation between an input parameter and an output parameter is in general non-linear. For such systems, a quiescent operating point is established through biasing, by which a bias control level is set to control a bias level within the device. At the specified bias condition, small variations of the input signal result in output variations of the respective output signal, related by a transfer function which is then a function of the bias condition; it is this dependence on bias, for the small-signal operation, which defines the non-linearity. And it is this transfer function, in the dynamic system, which is intended to be held constant over variation in system operating temperature.

Other devices operating as a dynamic system where the output is a quadratic function of the input, which is the characteristic of the GaAs FET and HEMT, upon which is based the circuit technique of the present invention, include Silicon MOS FETs and Silicon Junction FETs. The invention is also applicable to those devices.

The preferred embodiment of this invention is a monolithic C-MOS integrated circuit. However, other embodiments can also take advantage of the concept of the invention, by adding the essential new circuits to their existing embodiment. These embodiments may include silicon bipolar hybrid, discrete or monolithic integrated circuits; silicon C-MOS hybrid or discrete circuits; mixed silicon (bipolar and C-MOS, or biCMOS) hybrid, discrete, or silicon integrated circuits, GaAs and HEMT hybrid, discrete or integrated circuits, as well as analogous circuits in other technologies not here mentioned.

Appendix A: Bias Concept for Intrinsic Gain Stabilization Over Temperature

The modeling of GaAs Fets and HEMTs for behavior over temperature is extremely complex and there is no general model incorporating all the relevant device physics. However, for devices operating in the pinchoff (also called saturation) mode it appears to be a reasonable assumption to use the square-law formulation[1] for drain current $I_{ds}$ as a function of the gate-source voltage $V_g$, from which we can draw some important conclusions:

$$I_{ds} = \beta [V_g - V_{th}]^2, \tag{1}$$

where $$\beta = \frac{2\epsilon V_{sat}}{A[V_{bi} - V_{th}]}, \tag{2}$$

in which W is the FET width, A is the effective channel depth, $V_{bi}$ is the Schottky built-in voltage, $V_{th}$ is the device threshold voltage, and $\epsilon$ is the dielectric constant. In these equations, $V_{sat}$ is strongly temperature dependent, but $V_{th}$ and $V_{bi}$ are less so. $V_{th}$ will be treated here as constant along with the geometric factors.

References:
[1] Robert E. Anholt and Stanley E. Swirhun, "Experimental Investigation of the Temperature Dependence of GaAs FET Equivalent Circuits", IEEE Transactions on Electron Devices Vol. 39, No. 9, September 1992, pp. 2029–2036.

In a small-signal multi-stage amplifier design, noise figure, gain, and distortion of individual stages all important. We are concerned with how these properties behave, in a given design, as the amplifier is operated over a broad temperature range.

In particular, we are concerned with stabilizing total amplifier performance when the drain bias current is affected by temperature change.

In practice for most cases, noise and distortion performance for an amplifier stage have a relatively broad optima as a function of drain current, so that noise and distortion performance are relatively tolerant of the bias current change induced by temperature variation. Thus, it is the gain performance of the amplifier stages, which is a strong function of drain current, which becomes critical and upon which we focus our attention.

For a given device, operating below frequencies approaching its characteristic $F_t$, the key characteristic controlling gain is $G_m$, defined by:

$$G_m = \frac{\partial I_{ds}}{\partial V_g} = 2\beta[V_g - V_{th}] = \frac{2I_{ds}}{[V_g - V_{th}]} \tag{3}$$

To minimize the gain variation over temperature, the expression (3) for $G_m$ should be held constant. A scheme by which this can be accomplished uses the active bias configuration in FIG. 1, which introduces a means by which the reference voltage in the bias control element can be varied in response to $V_g$. This scheme presupposes that $V_{th}$, to which there is of course no direct circuit access (it is an internal device property), suffers relatively little temperature variation. Under these conditions, letting the subscript 0 denote variables at room temperature, the equations defining the active bias loop become:

$$I_{ds} = \frac{V_{dd} - V_{ref}}{R_d} = G_{m0}[V_g - V_{th}]/2 \tag{4}$$

$$V_{ref} = V_{dd} - G_{m0}R_d[V_g - V_{th}]/2 \tag{5}$$

These equations state that if $G_m$ is to be held constant, then $V_{ref}$ must vary in the manner prescribed. If we define $V_{g0}$ as the gate voltage at room temperature, associated with the room temperature value of $I_{ds}$, namely $I_{ds0}$, then (5) becomes:

$$V_{ref} = V_{dd} - \left[\frac{G_{m0}R_d}{2}\right][V_g - V_{g0} + V_{g0} - V_{th}] = \quad (6)$$

$$V_{dd} - I_{ds0}R_d - \left[\frac{G_{m0}R_d}{2}\right][V_g - V_{g0}]$$

In the schematic of FIG. 1, the amplifier gain is set to $-G_{m0}R_d/2$ and $V_{SET}$ is introduced as a setting for the room temperature bias current, to produce the effects of (6); from (6) we see that $V_{SET}$ must satisfy:

$$-\frac{[G_{m0}R_d]}{2}[V_{g0} - V_{SET}] = V_{ref} = V_{dd} - I_{ds0}R_d \quad (7)$$

which we see by setting $V_g = V_{g0}$ in (6). This results in a setting:

$$V_{SET} = V_{g0} + \frac{2[V_{dd} - I_{ds0}R_d]}{g_{m0}R_d} \quad (8)$$

As temperature then varies, the resulting adjustment of $V_{ref}$ by the variation in $V_g$ then forces an adjustment to the controlled $I_{ds}$ which satisfies the requirement that $G_m$ be held constant.

Appendix B: Intrinsic Temperature Compensation with Threshold Voltage Variation Equation (5) of Appendix A related $V_{ref}$ to device and circuit parameters for the condition of constant $G_m = G_{mo}$:

$$V_{ref} = V_{dd} - G_{mo}R_d[V_g - V_{th}]/2 \quad (1)$$

Because $V_{th}$ is now allowed to vary with temperature, then instead of identifying a control circuit variable as $V_g$ as we did before, we now define this variable as $V_{gth} = [V_g - V_{th}]$, and define its room temperature value as $V_{gth0}$. This leads to the control circuit equation:

$$V_{ref} = V_{dd} - G_{m0}R_dV_{gth}/2 \quad (2)$$

Since we are interested in departures from a room temperature setting of $I_{ds}$, namely $I_{ds0}$. Writing (1) for this condition we have $$V_{ref0} = V_{dd} - G_{m0}R_dV_{gth0}/2 \quad (3)$$

from which $$I_{ds0} \equiv \frac{[V_{dd} - V_{ref0}]}{R_d} = \frac{G_{m0}V_{gth0}}{2} \quad (4)$$

and from which we modify (2):

$$V_{ref} = V_{dd} - I_{ds0} - \frac{G_{m0}R_d}{2}[V_{gth} - V_{gth0}] \quad (5)$$

Figure 11:
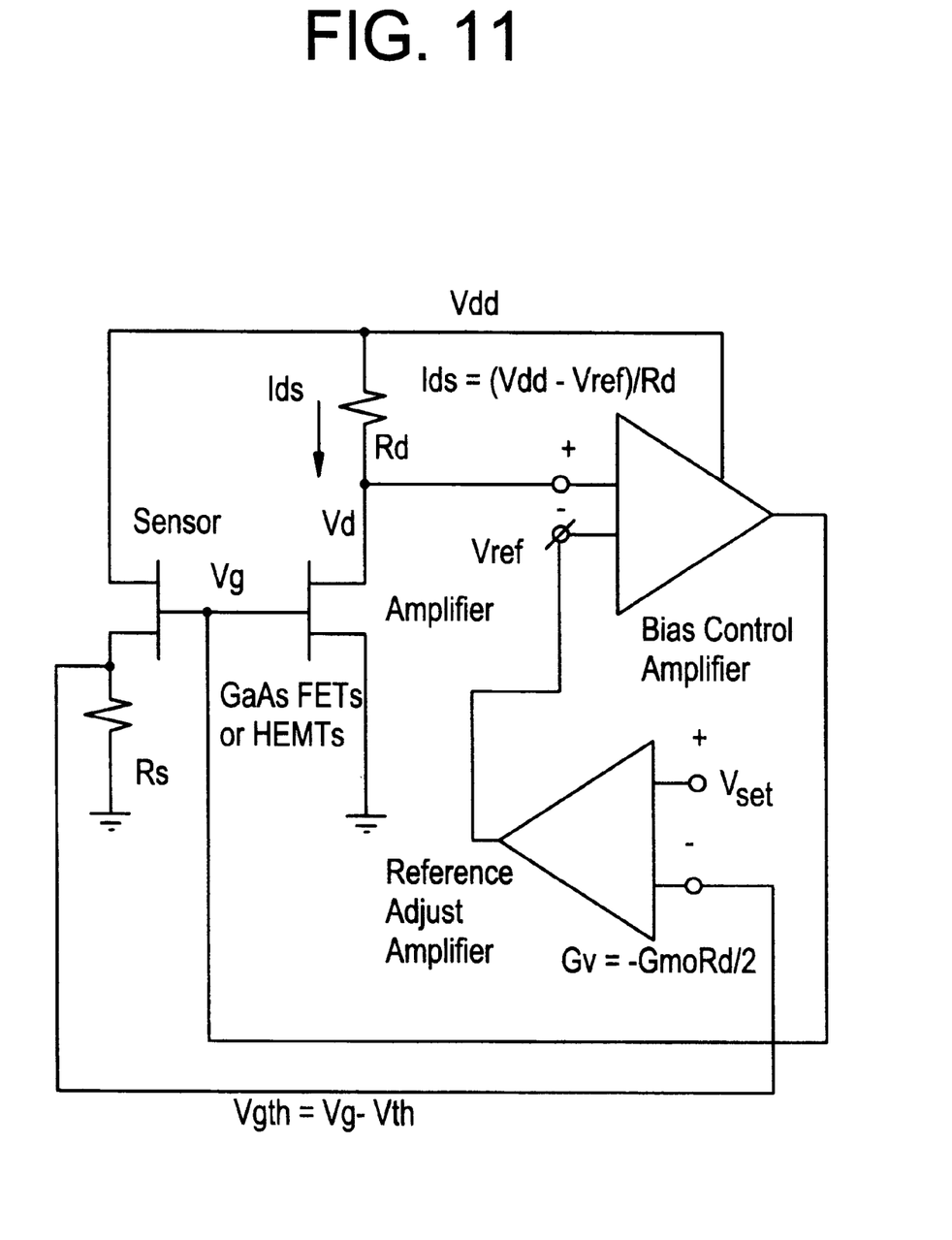
FIG. 11 is a block diagram illustrating intrinsic temperature compensation with variable threshold.

The quantity $V_{gth} \equiv [V_g - V_{th}]$ evidently provides the control of the bias reference necessary to maintain constant gain, as in the method of Appendix A. However, the availability of this quantity as a circuit measurement is not evident, since $V_{th}$ is an internal device constant. We can, nevertheless, infer a close approximation to its value from a measurement on a specific device connection, that shown in FIG. 11. In that figure, the external GaAs FET or HEMT amplifying device, is complemented with a separate sensor device of the same technology. The resistor from source to ground attached to the sensor device is selected to permit a small current to flow through the device, for the purpose of establishing an output resistance for the device which is small relative to the input resistance of the circuit to be attached (the input of an high impedance operational amplifier). For small drain current the gate-source voltage for the sensor device must satisfy $$[V_{gs} - V_{th}] = V_g - V_s - V_{th} \approx 0 \quad (6)$$

from which we obtain the desired circuit parameter $$[V_g - V_{th}] \approx V_s \quad (7)$$

Figure 10:
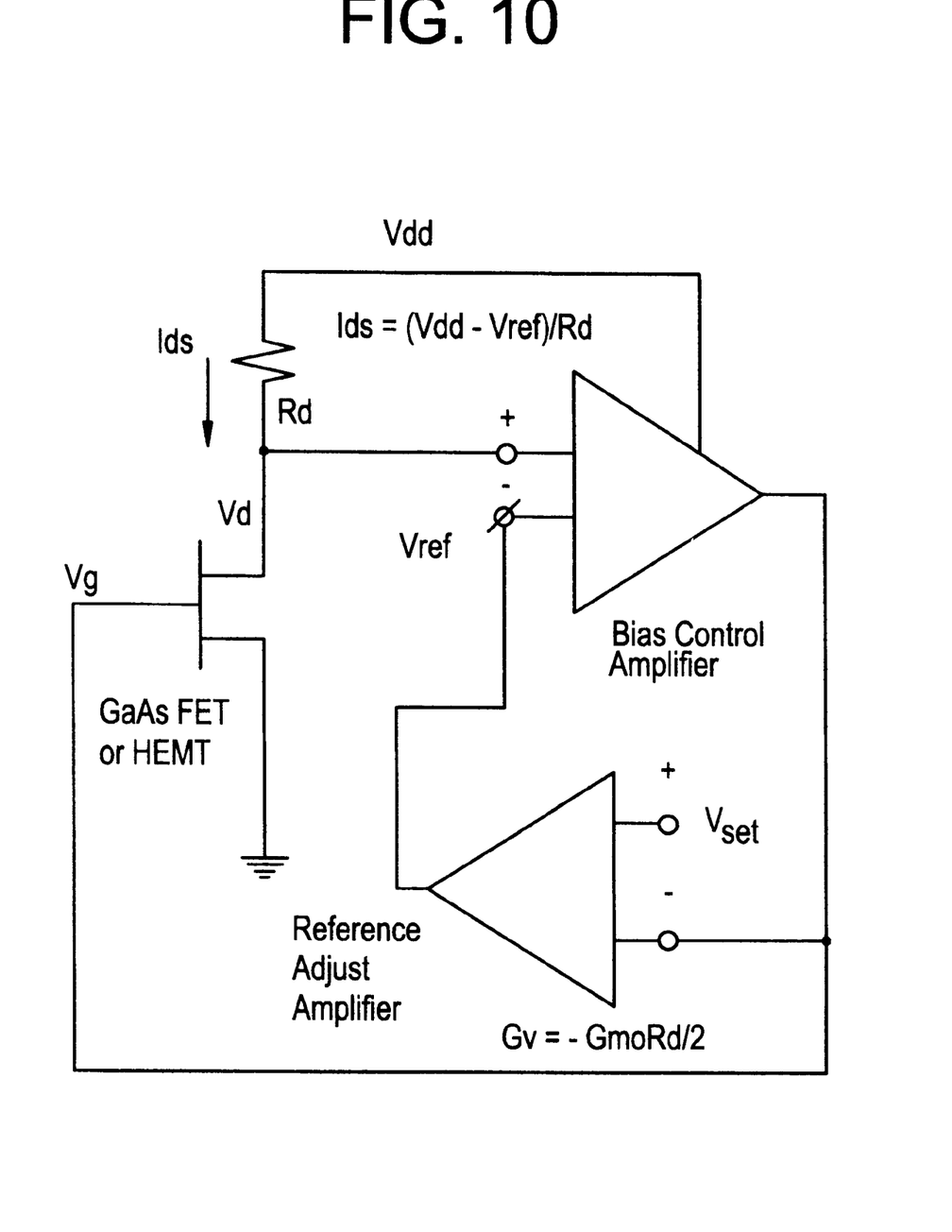
FIG. 10 is a block diagram of a Constant Gm active bias circuit.

The circuit of FIG. 11 modifies that of FIG. 10 to include this refinement, permitting variations of $V_{th}$ in the intrinsic temperature stabilization of $G_m \cdot V_{SET}$ is determined here in the same manner as in Appendix A, except the variable $V_{gth} = V_g - V_{th}$ is now used in the formulation.

I claim:

1. An amplifier circuit including a GaAs FET device having a drain, a source, and a control gate, and a double-loop active bias circuit for stabilizing the gain of the device, said amplifier circuit comprising:

a first feedback amplifier having a first input connected to the drain, a second input, and having an output connected to the control gate;

a second feedback amplifier having a first input connected to the control gate, a second input connected to a fixed voltage reference source, and an output connected to said second input of said first feedback amplifier; and the operation being such that the gate voltage fine-tunes a reference voltage applied to said second input of said first feedback amplifier.

2. An amplifier circuit including a GaAs FET device having a drain, a source, and a control gate, and a double-loop active bias circuit for stabilizing the gain of the device, the amplifier circuit comprising:

a first feedback amplifier having a first input connected to the drain, a second input, and having an output connected to the control gate; and a second feedback amplifier having a first input connected to the control gate, a second input connected to a bias reference setting voltage source, and an output connected to the second input of the first feedback amplifier;

thus applying to the control gate a bias control voltage that is a composite function of the bias reference setting voltage, the drain bias current, and the gate voltage itself.

3. In a system which includes a GaAs FET device capable of producing an output signal in response to an input signal, having a bias current which establishes a quiescent operating condition, a gate voltage controlling the bias current in accordance with a quadratic formula, wherein the gain of the device representing its desired response bears a mathematical relationship to the bias current, and characterized by the fact that temperature variations can independently vary the relationship of the bias current to the gate voltage, a closed-loop control system for maintaining system operation so as to stabilize the gain of the device at a desired response level, comprising:

means responsive to both the drain voltage and the gate voltage for controlling the gate voltage and hence indirectly the bias current to vary the quiescent operating condition so as to preserve an essentially constant value of the gain of the device;

the responsive means including a first closed-loop circuit for controlling gate voltage as a function of the drain voltage, and a second closed-loop circuit responsive to the gate voltage for modifying a reference voltage in said first closed-loop circuit, the second closed-loop circuit also being responsive to a fixed voltage reference that is a function of the quiescent gate control voltage of the device.

\* \* \* \* \*